US012609468B2

(12) United States Patent
Sun

(10) Patent No.: US 12,609,468 B2
(45) Date of Patent: Apr. 21, 2026

(54) POWER CONNECTOR ASSEMBLY, POWER SUPPLY SYSTEM, AND SERVER

(71) Applicant: SUZHOU METABRAIN INTELLIGENT TECHNOLOGY CO., LTD., Suzhou (CN)

(72) Inventor: Hui Sun, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/116,263

(22) PCT Filed: Apr. 23, 2024

(86) PCT No.: PCT/CN2024/089403
§ 371 (c)(1),
(2) Date: Mar. 27, 2025

(87) PCT Pub. No.: WO2025/081752
PCT Pub. Date: Apr. 24, 2025

(65) Prior Publication Data
US 2026/0005456 A1     Jan. 1, 2026

(30) Foreign Application Priority Data
Oct. 17, 2023    (CN) .......................... 202311339832.1

(51) Int. Cl.
*H01R 12/70*        (2011.01)
*H01R 12/71*        (2011.01)
(Continued)

(52) U.S. Cl.
CPC ....... *H01R 12/7088* (2013.01); *H01R 12/712* (2013.01); *H05K 7/1492* (2013.01); *H05K 7/20718* (2013.01)

(58) Field of Classification Search
CPC .............. H01R 12/724; H01R 12/7088; H01R 12/712; H01R 12/71; H01R 13/02;
(Continued)

(56) References Cited

U.S. PATENT DOCUMENTS

2015/0313042 A1*  10/2015  Tsai ..................... H05K 7/1487
174/261

FOREIGN PATENT DOCUMENTS

| CN | 2269641 Y | 12/1997 |
| CN | 208862209 U | 5/2019 |

(Continued)

*Primary Examiner* — Roshn K Varghese
(74) *Attorney, Agent, or Firm* — IPro, PLLC

(57) ABSTRACT

The present application discloses a power connector assembly, a power supply system, and a server, belonging to the technical field of servers. The power connector assembly includes a first power connector, a connection member, and a second power connector. The first power connector and the second power connector are arranged in stacked, and a gap is provided between the first power connector and the second power connector. The connection member is located in the gap, and the connection member is separately fixedly connected to the first power connector and the second power connector. Both the first power connector and the second power connector are configured to connect a power supply for supplying power to a server.

20 Claims, 7 Drawing Sheets

(51) Int. Cl.
  *H05K 7/14*          (2006.01)
  *H05K 7/20*          (2006.01)
(58) Field of Classification Search
  CPC .............. H01R 13/514; H05K 7/1492; H05K
                              7/20718; Y02D 10/00
  See application file for complete search history.

(56)                    References Cited

FOREIGN PATENT DOCUMENTS

| | | | |
|---|---|---|---|
| CN | 116820216 | A | 9/2023 |
| CN | 117096641 | A | 11/2023 |

* cited by examiner

Before twisting

After twisting

POWER CONNECTOR ASSEMBLY, POWER SUPPLY SYSTEM, AND SERVER

CROSS-REFERENCE TO RELATED APPLICATION

This application claims the priority of the Chinese Patent application filed on Oct. 17, 2023 before the CNIPA, China National Intellectual Property Administration with the application number of 202311339832.1, and the title of "POWER CONNECTOR ASSEMBLY, POWER SUPPLY SYSTEM, AND SERVER", which is incorporated herein in its entirety by reference.

FIELD

The present application relates to the technical field of servers and more particularly, to a power connector assembly, a power supply system, and a server.

BACKGROUND

With the development of science and technology, the use of a server is gradually widespread. Generally, the server has a chassis. A power supply and a motherboard are arranged in the chassis. The power supply is electrically connected to the motherboard, whereby the power supply may supply power to the motherboard, and the power supply supplies power to the server. In the chassis, two power supplies are stacked up and down generally. Then, the two power supplies are respectively connected to connectors. The connectors are connected to a power board. The power board is connected to the motherboard through another connector, whereby the two power supplies are electrically connected to the motherboard, and the two power supplies supply power to the motherboard. However, such arrangement reduces space utilization in the chassis of the server, and causes a high cost of supplying power to the server.

SUMMARY

Some embodiments of the present application aim to provide a power connector assembly, a power supply system, and a server, which at least solve the problems that space utilization in a chassis of a server is reduced and the cost of supplying power to the server is high.

According to a first aspect, some embodiments of the present application provide a power connector assembly. The power connector assembly includes a first power connector, a connection member, and a second power connector.

The first power connector and the second power connector are arranged in stacked, and a gap is provided between the first power connector and the second power connector. The connection member is located in the gap, and the connection member is separately fixedly connected to the first power connector and the second power connector.

Both the first power connector and the second power connector are configured to connect a power supply for supplying power to a server, and are configured to connect a motherboard of the server.

In some embodiments, the connection member has a first connection portion, an intermediate connection portion, and a second connection portion;

the first connection portion, the intermediate connection portion, and the second connection portion are connected in sequence; and the first connection portion is connected to the first power connector, the second connection portion is connected to the second power connector, and the intermediate connection portion is provided with a plurality of through holes.

In some embodiments, the plurality of through holes are in a shape of at least one of a circle, a rhombus, a square, and a polygon, and a number of sides of the polygon is greater than or equal to 5.

In some embodiments, the connection member is made of an insulating material.

In some embodiments, the first power connector includes a first housing, a plurality of first connection terminals, and a plurality of first connection plates, the power supply includes a gold finger, and the server includes a motherboard;

the first housing has a first accommodating cavity and a first opening, the plurality of first connection terminals are mounted on a cavity wall of the first accommodating cavity, the first connection terminals are in one-to-one correspondence with the first connection plates, and the first connection terminals are electrically connected to the first connection plates; the first connection plates are located outside the first accommodating cavity and are located on a side of the first accommodating cavity away from the first opening, the first connection terminals are configured to abut against the gold finger, and the first connection plates are configured to be connected to the motherboard;

the second power connector includes a second housing, a plurality of second connection terminals, and a plurality of second connection plates; the second housing has a second accommodating cavity and a second opening, the plurality of second connection terminals are mounted on a cavity wall of the second accommodating cavity, the second connection terminals are in one-to-one correspondence with the second connection plates, and the second connection terminals are electrically connected to the second connection plates; the second connection plates are located outside the second accommodating cavity and are located on a side of the second accommodating cavity away from the second opening; and the second connection terminals are configured to abut against the gold finger, the second connection plates are configured to be connected to the motherboard, and the second housing is configured to be in contact with the motherboard.

In some embodiments, a second fixing table is fixedly connected to an outer wall of the second housing, the second fixing table is provided with a second fixing hole, and the second fixing hole is configured for penetration of a fixing member, to connect the second fixing table to the motherboard, so that the second housing is fixed relative to the motherboard.

In some embodiments, the server includes a chassis, a first fixing table is fixedly connected to an outer wall of the first housing, the first fixing table is provided with a first fixing hole, and the first fixing hole is configured for penetration of a fixing member, to fixedly connect the first fixing table to the chassis, so that the first housing is fixed relative to the chassis.

In some embodiments, the second fixing table is separately fixedly connected to opposite sides of the second housing.

In some embodiments, a support member is fixedly connected to the second housing, an extension direction of the support member is parallel to a direction from the second opening to the second accommodating cavity, and the support member is configured to come into contact with the motherboard when the second housing is in contact with the motherboard, and supports the second housing in a direction parallel to the motherboard.

In some embodiments, the support member is fixedly connected to an outer wall of the second housing away from the second opening.

In some embodiments, a thickness of the support member is equal to a thickness of the second housing.

In some embodiments, the support member is made of an insulating material.

In some embodiments, the support member is fixedly connected to a partial edge of the second opening.

In some embodiments, the first connection plate is bent to form a first connection sub-plate and a second connection sub-plate; the first connection sub-plate is connected to the second connection sub-plate, and the first connection sub-plate is connected to the first connection terminal; the second connection sub-plate covers the connection member in a direction from the first accommodating cavity to the first opening, and the second connection sub-plate is configured to be connected to the motherboard; and the second connection sub-plate is twisted relative to the connection member to increase a gap between two adjacent second connection sub-plates.

In some embodiments, the second connection plate is bent to form a third connection sub-plate and a fourth connection sub-plate; the third connection sub-plate is connected to the fourth connection sub-plate, and the third connection sub-plate is connected to the second connection terminal; and a distance from the second connection sub-plate to the first housing is greater than a distance from the fourth connection sub-plate to the second housing.

In some embodiments, the first connection plate includes a first-type connection plate and a second-type connection plate, and a width of the first-type connection plate is greater than a width of the second-type connection plate.

In a second aspect, some embodiments of the present application provide a power supply system, including one or a plurality of power supplies, a motherboard, and the power connector assembly according to any one of the first aspect, wherein the power supply has a gold finger, and both the first power connector and the second power connector are connected to the motherboard;

in response to one power supply, the gold finger of the power supply is inserted into the second power connector; and in response to the plurality of power supplies, the plurality of power supplies are arranged in stacked, the gold finger of one of two adjacent power supplies among the plurality of power supplies is inserted into the first power connector, and the gold finger of the other of the two adjacent power supplies is inserted into the second power connector.

In some embodiments, the first power connector includes a first housing, a plurality of first connection terminals, and a plurality of first connection plates, and the second power connector includes a second housing, a plurality of second connection terminals, and a plurality of second connection plates; and the second housing is in contact with the motherboard, and both the first connection plate and the second connection plate are electrically connected to the motherboard.

In some embodiments, the connection member has a first connection portion, an intermediate connection portion, and a second connection portion; the first connection portion, the intermediate connection portion, and the second connection portion are connected in sequence; the first connection portion is connected to the first power connector, the second connection portion is connected to the second power connector, and the intermediate connection portion is provided with a plurality of through holes; and in a direction from the second power connector to the power supply, the intermediate connection portion faces the power supply inserted into the second power connector, and the plurality of through holes all face the power supply inserted into the second power connector.

In some embodiments, a support member is fixedly connected to the second housing, the second housing is in contact with the motherboard, and the support member is in contact with the motherboard, and supports the second housing in a direction parallel to the motherboard.

In some embodiments, a second fixing table is fixedly connected to an outer wall of the second housing, the second fixing table is provided with a second fixing hole, a fixing member penetrates into the second fixing hole, and the fixing member is connected to the motherboard, to connect the second fixing table to the motherboard, so that the second housing is fixed relative to the motherboard.

In a third aspect, some embodiments of the present application provide a server, including a chassis and the power supply system according to any one of the second aspect, wherein the power supply system is located in the chassis.

In some embodiments of the present application, the first power connector and the second power connector are stacked, and the gap is provided between the first power connector and the second power connector. The connection member is located in the gap, and the connection member is separately fixedly connected to the first power connector and the second power connector. Therefore, when the power connector assembly provided by some embodiments of the present application is used, that is, when the power connector assembly provided by some embodiments of the present application is applied to a chassis of a server, two power supplies stacked up and down in the chassis may be connected to the first power connector and the second power connector, respectively, and the first power connector and the second power connector may be directly connected to a motherboard in the chassis, whereby the two power supplies stacked up and down are electrically connected to the motherboard through the power connector assembly of the present application, thereby supplying power to the motherboard, namely, supplying power to the server. That is, in some embodiments of the present application, the first power connector and the second power connector are stacked, and the connection member is arranged between the first power connector and the second power connector and is separately connected to the first power connector and the second power connector, whereby when the power connector assembly is applied to the chassis of the server, the two power supplies stacked up and down are connected to the first power connector and the second power connector, respectively, and the first power connector and the second power connector are connected to the motherboard in the chassis, thereby supplying power to the motherboard, avoiding using a power board and a plurality of connectors, and reducing the cost of supplying power to the server. In addition, only using the power connector assembly according to some embodiments of the present application is equivalent to reducing the number of devices in the chassis, whereby less space is occupied in the chassis, and space utilization in the chassis is improved. In addition, once there are fewer devices in the chassis, there is more space left for the motherboard in the chassis, thereby increasing the size of the motherboard.

REFERENCE NUMERALS

001: power supply; 002: first connector; 003: second connector; 004: power board; 005: third connector; 006: fourth connector; 10: first power connector; 20: connection member; 30: second power connector; 11: first housing; 12: first connection terminal; 13: first connection plate; 14: first fixing table; 21: first connection portion; 22: intermediate connection portion; 23: second connection portion; 31: second housing; 32: second connection terminal; 33: second connection plate; 34: second fixing table; 35: support member; 111: first accommodating cavity; 112: first opening; 131: first connection sub-plate; 132: second connection sub-plate; 141: first fixing hole; 221: through hole; 311: second accommodating cavity; 312: second opening; 331: third connection sub-plate; 332: fourth connection sub-plate; 341: second fixing hole; 1301: first-type connection plate; 1302: second-type connection plate; 100: power supply; 110: gold finger; 300: motherboard.

DETAILED DESCRIPTION

The terms "first" and "second" in the specification and claims of the present application may explicitly or implicitly include one or more of these features. In the description of the present application, unless otherwise specified, the meaning of "plurality of" refers to two or more. In addition, in the specification and claims, "and/or" represents at least one of the connected objects, and the character "/" generally indicates a "or" relationship between the related objects.

In the description of the present application, it should be understood that the terms "center", "longitudinal", "transverse", "length", "width", "thickness", "up", "down", "front", "back", "left", "right", "vertical", "horizontal", "top", "bottom", "inside", "outside", "clockwise", "counterclockwise", "axial", "radial", "circumferential" and other directional or positional relationships indicated are based on the directional or positional relationships shown in the accompanying drawings, and are only for the convenience of describing the present application and simplifying the description, and do not indicate or imply that the devices or components referred to must have specific orientation and be constructed and operated in a specific orientation, therefore, it may not be understood as a limitation of the present application.

In the description of the present application, it should be noted that unless otherwise specified and limited, the terms "installation", "connected", and "connection" should be broadly understood, for example, they may be fixed connections, detachable connections, or integral connections; It may be a mechanical connection or an electrical connection. It may be directly connected, indirectly connected through an intermediate medium, or connected internally between two components. For persons skilled in the art, the specific meanings of the above terms in the present application may be understood in specific situations.

Figures 1, 2:
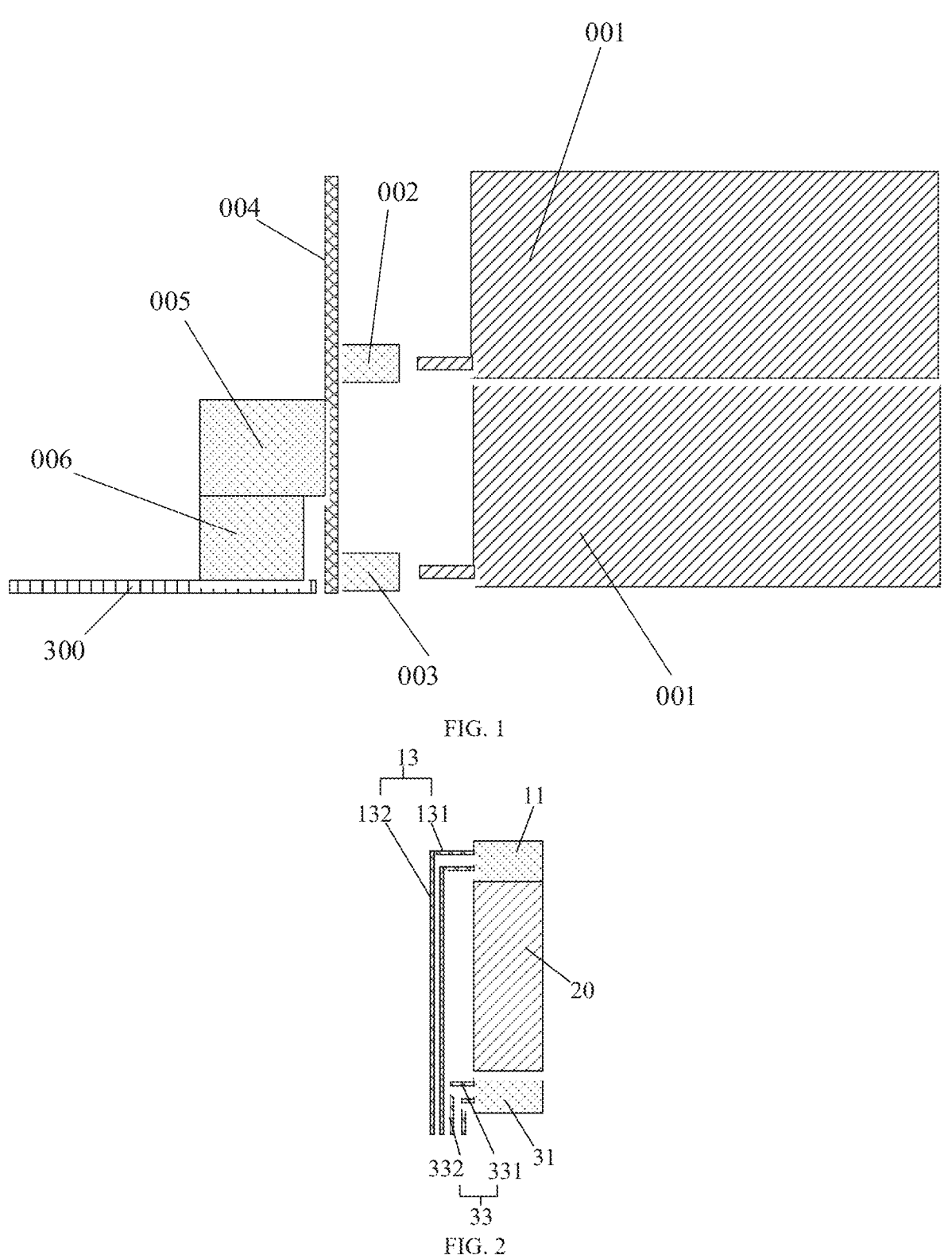
FIG. 1 shows a schematic diagram of stacked power supplies for supplying power to a motherboard of a server in the related art.
FIG. 2 shows a first side view of a power connector assembly according to some embodiments of the present application.

Before describing a power connector assembly provided by some embodiments of the present application, an application background of the power connector provided by some embodiments of the present application is firstly described: in the related art, when supplying power to a server, a common redundancy power supply (CRPS) is usually used for power supply. The common redundancy power supply is hereinafter referred to as a power supply for short. When the power supply supplies power to the server, as shown in FIG. 1, in a chassis of the server, two power supplies 001 are generally required to be stacked up and down to realize 1+1 redundancy. Then the two power supplies 001 are separately connected to a power board 004 through a first connector 002 and a second connector 003. A third connector 005 is arranged on the power board 004, and a fourth connector 006 is arranged on a motherboard 300. The third connector 005 is connected to the fourth connector 006, whereby the power board 004 is connected to the motherboard 300 through the third connector 005 and the fourth connector 006. Finally, the two power supplies 001 supply power to the motherboard 300, thereby supplying power to the server. However, in the related art, to support a structural form of the two power supplies 001 stacked up and down, four connectors are required. In addition, one power board 004 is further required, which leads to a high cost of supplying power to the server. Furthermore, more components occupy more space in the chassis of the server, reduce space utilization in the chassis, and reduce the size of the motherboard 300.

As shown in FIG. 1 to FIG. 13, the power connector assembly includes a first power connector 10, a connection member 20, and a second power connector 30. The first power connector 10 and the second power connector 30 are arranged in stacked, and a gap is provided between the first power connector 10 and the second power connector 30. The connection member 20 is located in the gap, and the connection member 20 is separately fixedly connected to the first power connector 10 and the second power connector 30. Both the first power connector 10 and the second power connector 30 are configured to connect a power supply for supplying power to a server, and are configured to connect a motherboard 300 of the server.

In some embodiments of the present application, the first power connector 10 and the second power connector 30 are arranged in stacked, and the gap is provided between the first power connector 10 and the second power connector 30. The connection member 20 is located in the gap, and the connection member 20 is separately fixedly connected to the first power connector 10 and the second power connector 30. Therefore, when the power connector assembly provided by some embodiments of the present application is used, that is, when the power connector assembly provided by some embodiments of the present application is applied to a chassis of a server, two power supplies stacked up and down in the chassis may be connected to the first power connector 10 and the second power connector 30, respectively, and the first power connector 10 and the second power connector 30 may be directly connected to the motherboard 300 in the chassis, whereby the two power supplies stacked up and down are electrically connected to the motherboard 300 through the power connector assembly of the present application, thereby supplying power to the motherboard 300, namely, supplying power to the server. That is, in some embodiments of the present application, the first power connector 10 and the second power connector 30 are arranged in stacked, and the connection member 20 is arranged between the first power connector 10 and the second power connector 30 and is separately connected to the first power connector 10 and the second power connector 30, whereby when the power connector assembly is applied to the chassis of the server, the two power supplies stacked up and down are connected to the first power connector 10 and the second power connector 30, respectively, and the first power connector 10 and the second power connector 30 are connected to the motherboard 300 in the chassis, thereby supplying power to the motherboard 300, avoiding using a power board 004 and a plurality of connectors, and reducing the cost of supplying power to the server. In addition, only using the power connector assembly according to some embodiments of the present application is equivalent to reducing the number of devices in the chassis, whereby less space is occupied in the chassis, and space utilization in the chassis 300 is improved. In addition, once there are fewer devices in the chassis, there is more space left for the motherboard in the chassis, thereby increasing the size of the motherboard 300.

It should be noted that in some embodiments of the present application, the motherboard 300 in the chassis of the server may be a printed circuit board (PCB), and electronic components are integrated on the motherboard 300.

In addition, in some embodiments of the present application, when the power connector assembly provided by some embodiments of the present application is actually applied, that is, when the power connector assembly is applied to the chassis of the server, the power supplies in the chassis of the server are stacked up and down. At this moment, a placement mode of the power connector assembly may be adjusted, whereby the first power connector 10 and the second power connector 30 are also stacked up and down. In addition, the first power connector 10 corresponds to the upper power supply, and the second power connector 30 corresponds to the lower power supply. Then the upper power supply may be connected to the first power connector 10, and the lower power supply may be connected to the second power connector 30. The connection member 20 plays a supporting role, that is, the connection member 20 supports the first power connector 10. Finally, both the first power connector 10 and the second power connector 30 are connected to the motherboard 300 in the chassis, whereby the power supplies stacked up and down are connected to the motherboard 300 through the power connector assembly, and power may be supplied to the motherboard 300.

Figure 3:
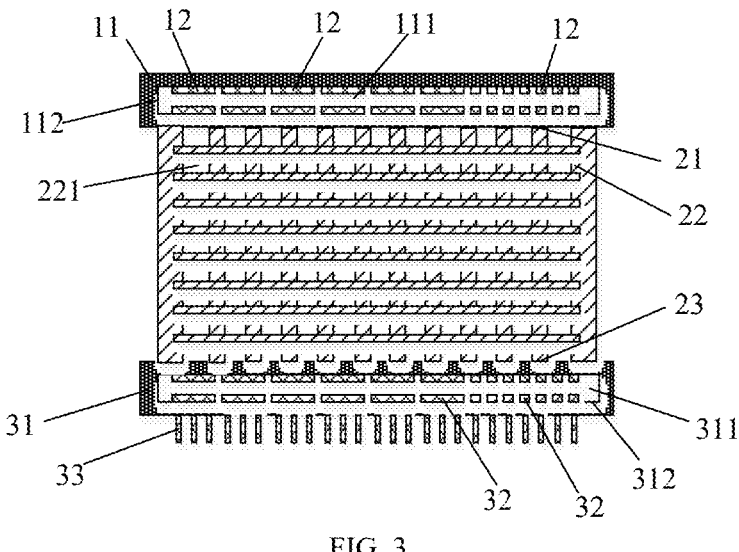
FIG. 3 shows a first front view of a power connector assembly according to some embodiments of the present application.
Figure 4:
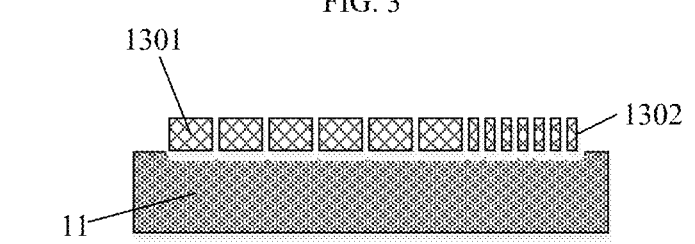
FIG. 4 shows a first top view of a power connector assembly according to some embodiments of the present application.

In addition, in some embodiments, as shown in FIG. 3, the connection member 20 has a first connection portion 21, an intermediate connection portion 22, and a second connection portion 23. The first connection portion 21, the intermediate connection portion 22, and the second connection portion 23 are connected in sequence. The first connection portion 21 is connected to the first power connector 10. The second connection portion 23 is connected to the second power connector 30. The intermediate connection portion 22 is provided with a plurality of through holes 221.

When the power connector assembly provided by some embodiments of the present application is applied, that is, when the power connector assembly is applied to the chassis of the server, the chassis has power supplies stacked up and down. The upper power supply is connected to the first power connector 10, and the lower power supply is connected to the second power connector 30. At this moment, the connection member 20 covers the lower power supply in a direction from the second power connector 30 to the lower power supply, thereby affecting heat dissipation of the lower power supply. To this end, in some embodiments of the present application, the plurality of through holes 221 are provided on the intermediate connection portion 22 of the connector. Therefore, once the upper power supply is connected to the first power connector 10 and the lower power supply is connected to the second power connector 30, although the connection member 20 covers the lower power supply, the plurality of through holes 221 on the intermediate connection portion 22 of the connector may be used for ventilation, whereby cold air in the server may be transmitted to the lower power supply through the plurality of through holes 221, and heat may be effectively dissipated from the lower power supply. That is, by providing the plurality of through holes 221 on the intermediate connection portion 22, it may effectively dissipate heat from the lower power supply of the power supplies stacked up and down in the server after the power connector of the present application is actually applied to the server.

It should be noted that a cold air window is generally arranged on the chassis of the server. After the power connector assembly of the present application is applied to the chassis of the server, the cold air window faces the connection member 20. The intermediate connection portion 22 of the connection member 20 is provided with the plurality of through holes 221, which may ensure that cold air is transmitted to the lower power supply through a plurality of windows. The upper power supply is not covered by the connection member 20, and heat dissipation from the upper power supply is not affected.

In addition, in some embodiments, the through holes 221 are in a shape of at least one of a circle, a rhombus, a square, and a polygon. The number of sides of the polygon is greater than or equal to 5.

The through holes 221 may be only in a shape of a circle, or only in a shape of a square, or only in a shape of a rhombus, or only in a shape of a polygon. Certainly, the through holes 221 may alternatively be in a shape of a combination of the circle, the rhombus, the square, and the polygon. For example, some through holes 221 are circular, and some through holes 221 are square. For another example, some through holes 221 are rhombic, and some through holes 221 are circular. For another example, some through holes 221 are circular, some through holes 221 are polygonal, and some through holes 221 are square.

It should be noted that the number of sides of the polygon is greater than or equal to 5, which means that the polygon is a polygon having at least five sides. For example, the polygon is a pentagon. For another example, the polygon is a hexagon. For another example, the polygon is an octagon.

In addition, in some embodiments of the present application, the through holes 221 may alternatively be in another shape. For example, the through holes 221 are in a shape of a triangle. For another example, the through holes 221 are in a shape of a pentagram. The shape of the through holes 221 is not limited in some embodiments of the present application herein.

In addition, in some embodiments, the connection member 20 is made of an insulating material. With such arrangement, the connection member 20 may have insulating properties, whereby the connection member 20 does not conduct electricity after the power connector assembly is applied to the server, thereby avoiding a problem that electric energy may be leaked after the first power connector 10 or the second power connector 30 is connected to the power supply and the connection member 20 transmits the leaked electric energy. That is, by forming the connection member 20 of an insulating material, it may improve the safety of supplying power to the server.

It should be noted that the material of the connection member 20 may be an insulating material such as plastic or thermosetting plastic.

In addition, in some embodiments, as shown in FIG. 2 and FIG. 3, the first power connector 10 includes a first housing 11, a plurality of first connection terminals 12, and a plurality of first connection plates 13. The power supply includes a gold finger. The server includes a motherboard 300. The first housing 11 has a first accommodating cavity 111 and a first opening 112. The plurality of first connection terminals 12 are mounted on a cavity wall of the first accommodating cavity 111. The first connection terminals 12 are in one-to-one correspondence with the first connection plates 13, and the first connection terminals 12 are electrically connected to the first connection plates 13. The first connection plates 13 are located outside the first accommodating cavity 111 and are located on a side of the first accommodating cavity 111 away from the first opening 112. The first connection terminals 12 are configured to abut against the gold finger. The first connection plates 13 are configured to be connected to the motherboard 300. The second power connector 30 includes a second housing 31, a plurality of second connection terminals 32, and a plurality of second connection plates 33. The second housing 31 has a second accommodating cavity 311 and a second opening 312. The plurality of second connection terminals 32 are mounted on a cavity wall of the second accommodating cavity 311. The second connection terminals 32 are in one-to-one correspondence with the second connection plates 33, and the second connection terminals 32 are electrically connected to the second connection plates 33. The second connection plates 33 are located outside the second accommodating cavity 311 and are located on a side of the second accommodating cavity 311 away from the second opening 312. The second connection terminals 32 are configured to abut against the gold finger. The second connection plates 33 are configured to be connected to the motherboard 300. The second housing 31 is configured to be in contact with the motherboard 300.

With such arrangement, when the power connector assembly is applied to the chassis of the server, the gold finger of the upper power supply of the two power supplies stacked up and down in the chassis of the server may be inserted into the first accommodating cavity 111 through the first opening 112 and is in contact with the first connection terminal 12 in the first accommodating cavity 111. The gold finger of the lower power supply may be inserted into the second accommodating cavity 311 through the second opening 312 and is in contact with the second connection terminal 32 in the second accommodating cavity 311. Then, both the first connection plate 13 and the second connection plate 33 may be connected to the motherboard 300, and the second housing 31 may be in contact with the motherboard 300, whereby it is equivalent to stacking the first power connector 10 and the second power connector 30 on the motherboard 300 and connecting to the two power supplies stacked up and down, respectively. The first connection plate 13 is electrically connected to the first connection terminal 12, and the second connection plate 33 is electrically connected to the second connection terminal 32. Therefore, once the first connection plate 13 is connected to the motherboard 300, the second connection plate 33 is connected to the motherboard 300, the gold finger of the upper power supply is inserted into the first accommodating cavity 111 to be in contact with the first connection terminal 12, and the gold finger of the lower power supply is inserted into the second accommodating cavity 311 to be in contact with the second connection terminal 32, the power supplies stacked up and down are connected to the motherboard 300 through the power connector assembly, whereby the power supplies stacked up and down may supply power to the motherboard 300, thereby supplying power to the server.

It should be noted that in some embodiments of the present application, both the first housing 11 and the second housing 31 may be formed of an insulating material. The insulating material includes, but is not limited to, plastic or thermosetting plastic. In addition, in some embodiments of the present application, when all the support member 35, the first housing 11, and the second housing 31 are made of an insulating material, the support member 35, the first housing 11, and the second housing 31 are integrally formed by an injection molding process.

Figure 5:
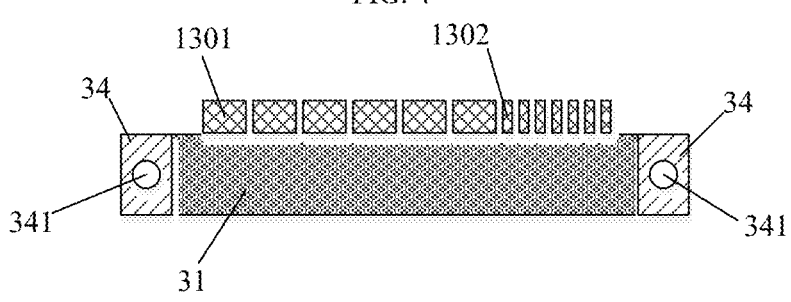
FIG. 5 shows a first top view of a second power connector according to some embodiments of the present application.

In addition, in some embodiments, as shown in FIG. 5, a second fixing table 34 is fixedly connected to an outer wall of the second housing 31. The second fixing table 34 is provided with a second fixing hole 341. The second fixing hole 341 is configured for penetration of a fixing member, to connect the second fixing table 34 to the motherboard 300, whereby the second housing 31 is fixed relative to the motherboard 300.

With such arrangement, when the power connector assembly provided by some embodiments of the present application is applied to the chassis of the server, the second housing 31 may be in contact with the motherboard 300 in the chassis. In addition, the fixing member is embedded in the motherboard 300 by penetration of the fixing member into the second fixing hole 341 on the second fixing table 34, whereby the second fixing table 34 and the motherboard 300 are connected through the fixing member, and the second fixing table 34 is fixedly connected to the second housing 31. After the second fixing base 34 is connected to the motherboard 300, the second housing 31 is equivalent to being fixed to the motherboard 300, thereby avoiding a problem of the second housing 31 shaking relative to the motherboard 300. That is, by arranging the second fixing table 34 and arranging that The second fixing table 34 is provided with the second fixing hole 341, the second housing 31 may be fixed relative to the motherboard 300. Therefore, when the gold finger of the power supply in the chassis is inserted into the second housing 31, the second housing 31 is stable, and the gold finger may be inserted into the second accommodating cavity 311 of the second housing 31.

It should be noted that the second fixing table 34 may be integrally formed with the second housing 31. Certainly, the second fixing table 34 may alternatively be fixedly connected to the second housing 31. For example, the second fixing table 34 is welded to the second housing 31 through a welding process. For another example, the second fixing table 34 is fixed to the second housing 31 through screws.

In addition, the motherboard 300 is provided with a connection hole corresponding to the second fixing hole 341. After the fixing member penetrates into the second fixing hole 341 on the second fixing table 34, the fixing member may be embedded into the connection hole, whereby the second fixing table 34 is connected to the motherboard 300.

Figure 6:
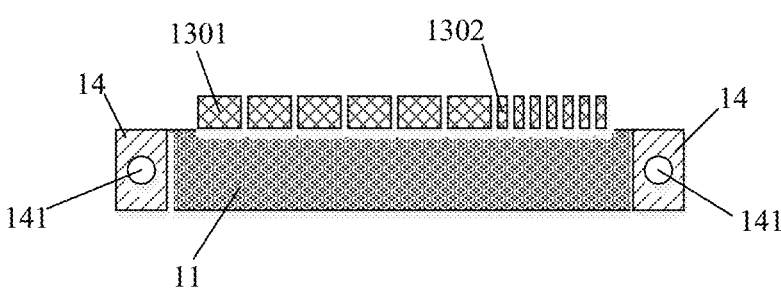
FIG. 6 shows a top view of a first power connector according to some embodiments of the present application.
Figures 7, 8:
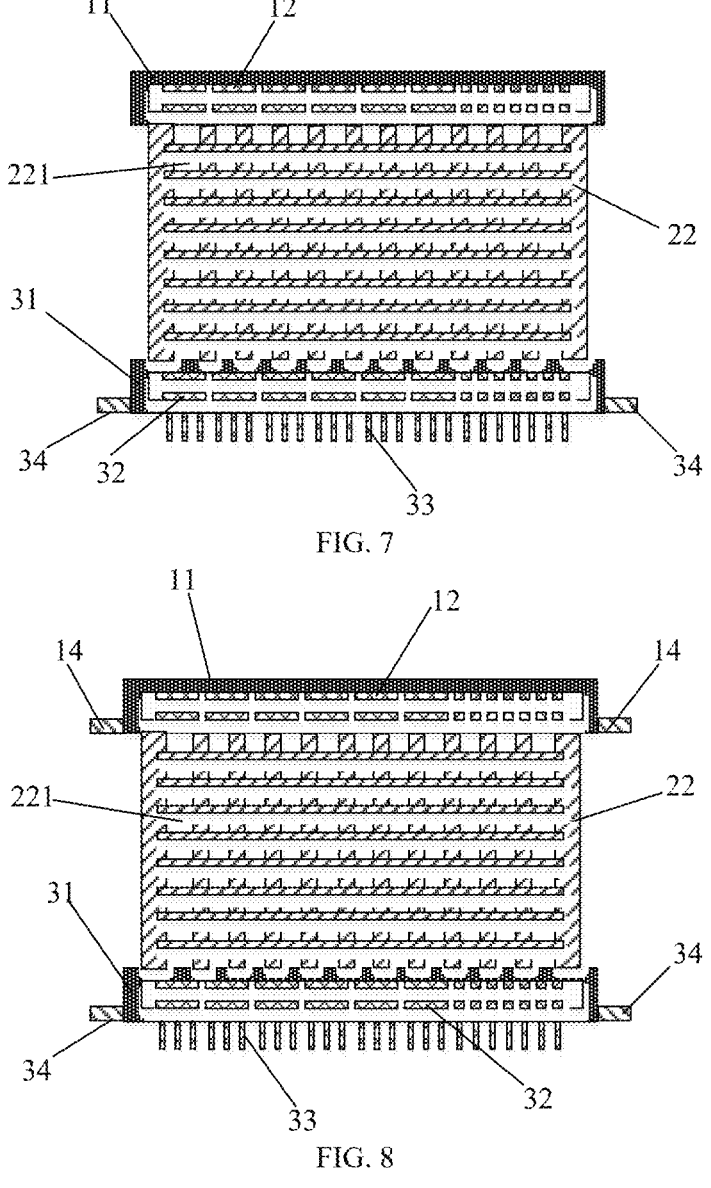
FIG. 7 shows a second front view of a power connector assembly according to some embodiments of the present application.
FIG. 8 shows a third front view of a power connector assembly according to some embodiments of the present application.

In addition, in some embodiments, as shown in FIG. 6 and FIG. 8, the server includes a chassis. A first fixing table 14 is fixedly connected to an outer wall of the first housing 11, the first fixing table 14 is provided with a first fixing hole 141. The first fixing hole 141 is configured for penetration of a fixing member, to fixedly connect the first fixing table 14 to the chassis, whereby the first housing 11 is fixed relative to the chassis.

With such arrangement, when the power connector assembly is applied to the chassis of the server, not only the fixing member may penetrates into the second fixing hole 341 of the second fixing table 34, whereby the second housing 31 is fixed to the motherboard 300, but also the fixing member may penetrates into the first fixing hole 141 of the first fixing table 14 to fixedly connect the first fixing table 14 to the chassis, whereby the first housing 11 is fixed relative to the chassis. Then, when the gold fingers of the power supplies stacked up and down in the chassis are inserted into the first accommodating cavity 111 of the first housing 11 and the second accommodating cavity 311 of the second housing 31, respectively, the first housing 11 and the second housing 31 shake less, thereby facilitating the insertion of the gold fingers.

It should be noted that in some embodiments of the present application, the fixing member may include, but is not limited to, a screw, a pin, a rivet, or the like.

In addition, in some embodiments, the second fixing table 34 is separately fixedly connected to opposite sides of the second housing 31. With such arrangement, the opposite sides of the second housing 31 may be fixed to the motherboard 300, whereby the second housing 31 may be fixed more firmly, thereby facilitating improving the stability of the second housing 31 relative to the motherboard 300.

Figures 9, 10, 11:
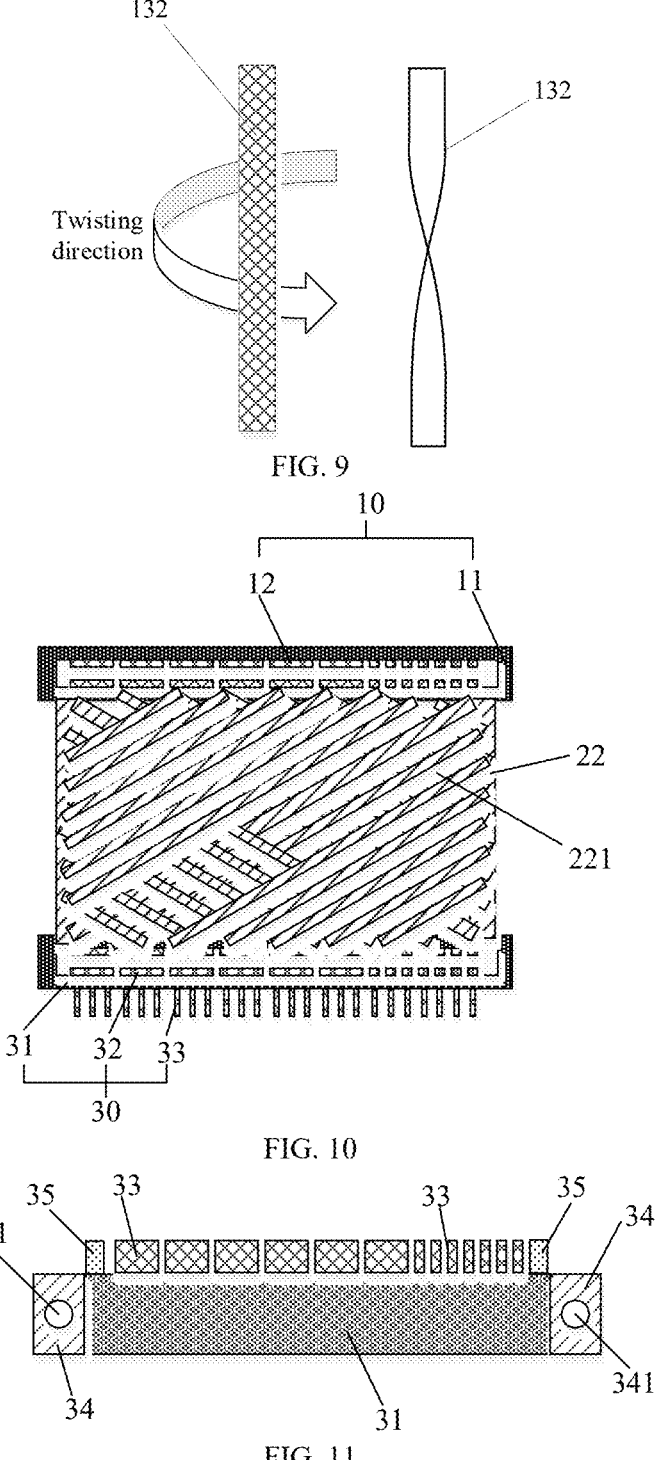
FIG. 9 shows a first schematic diagram of twisting a second connection sub-plate according to some embodiments of the present application.
FIG. 10 shows a fourth front view of a power connector assembly according to some embodiments of the present application.
FIG. 11 shows a second top view of a second power connector according to some embodiments of the present application.
Figures 12, 13:
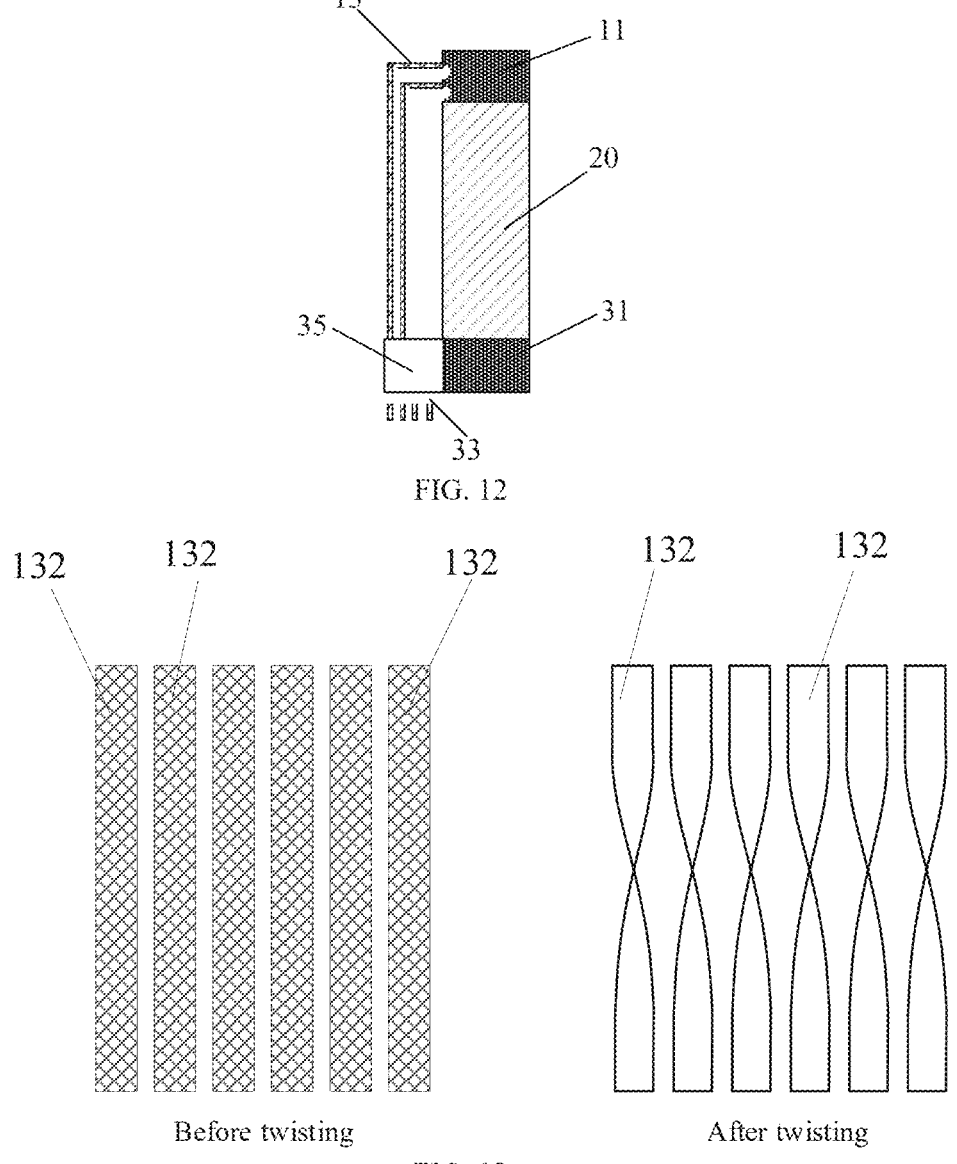
FIG. 12 shows a second side view of a power connector assembly according to some embodiments of the present application.
FIG. 13 shows a second schematic diagram of twisting a second connection sub-plate according to some embodiments of the present application.

In addition, in some embodiments, as shown in FIG. 11 and FIG. 12, a support member 35 is fixedly connected to the second housing 31, and an extension direction of the support member 35 is parallel to a direction from the second opening 312 to the second accommodating cavity 311. The support member 35 is configured to come into contact with the motherboard 300 when the second housing 31 is in contact with the motherboard 300, and supports the second housing 31 in a direction parallel to the motherboard 300.

When the power connector assembly according to some embodiments of the present application is applied to the chassis of the server, the power supplies stacked up and down in the chassis of the server are connected to the first power connector 10 and the second power connector 30, respectively. That is, the gold finger of the upper power supply is inserted into the first accommodating cavity 111 in the first housing 11 of the first power connector 10, and the gold finger of the lower power supply is inserted into the second accommodating cavity 311 in the second housing 31 of the second power connector 30. Either for the gold finger of the upper power supply is inserted into the first power connector 10 or the gold finger of the lower power supply is inserted into the second power connector 30, the insertion directions are both parallel to a surface of the motherboard 300, whereby the first power connector 10 or the second power connector 30 may shake when the gold finger is inserted into the first power connector 10 or the second power connector 30. To this end, according to the present application, the support member 35 is fixedly connected to the second housing 31, and the extension direction of the support member 35 is parallel to the direction from the second opening 312 to the second accommodating cavity 311, whereby the extension direction of the support member 35 is parallel to the surface of the motherboard 300. Therefore, once the second housing 31 is in contact with the motherboard 300, the support member 35 may also be in contact with the motherboard 300, and the support member 35 supports the second housing 31 in a direction parallel to the motherboard 300. That is, the second housing 31 is supported in a direction of inserting the gold finger into the second power connector 30, thereby avoiding a problem of the second housing 31 shaking due to the insertion, and facilitating the insertion of the gold finger into the second power connector 30. That is, by fixedly connecting the support member 35 to the second housing 31, it may facilitating the insertion of the gold finger into the second power connector 30, the second power connector 30 keeps stable, the gold finger may be inserted into the second power connector 30, and the gold finger may also be inserted into the first power connector 10.

In addition, in some embodiments, the support member 35 is fixedly connected to an outer wall of the second housing 31 away from the second opening 312.

With such arrangement, when the power connector assembly is applied to the chassis of the server, the gold finger of the lower power supply of the power supplies stacked up and down is inserted into the second power connector 30. In the process of inserting the gold finger into the second power connector 30, a force direction of the second housing 31 is from the second opening 312 to the second accommodating cavity 311, and the support member 35 is fixedly connected to the outer wall of the second housing 31 away from the second opening 312. Therefore, it is equivalent to arranging the support member 35 in the force direction of the second housing 31, and the support member 35 may effectively support the second housing 31, so as to avoid a problem that the second housing 31 may shake when the gold finger is inserted into the second housing 31.

In addition, in some embodiments, the support member 35 may also be fixedly connected to a partial edge of the second opening 312. With such arrangement, when the power connector assembly is applied to the chassis of the server, the gold finger of the lower power supply of the power supplies stacked up and down is inserted into the second power connector 30. When the lower power supply is required to be pulled out from the second power connector 30, the force direction of the second housing 31 is from the second accommodating cavity 311 to the second opening 312, thereby driving the second housing 31 of the second power connector 30 to shake. The support member 35 is fixedly connected to an edge of the second opening 312 on the second housing 31. It is equivalent to arranging the support member 35 in the force direction of the second housing 31, and the support member 35 may effectively support the second housing 31, so as to avoid a problem that the second housing 31 may shake when the gold finger is pulled out from the second housing 31.

In addition, in some embodiments, a thickness of the support member 35 is equal to a thickness of the second housing 31.

Such arrangement is equivalent to increasing the thickness of the support member 35, whereby the support member 35 may have higher strength, and the support member 35 has a better supporting effect on the second housing 31. When the thickness of the support member 35 is equal to the thickness of the second housing 31, the support member 35 is arranged on the outer wall of the second housing 31 away from the second opening 312.

In addition, in some embodiments, the support member 35 is made of an insulating material. With such arrangement, the support member 35 may have insulating properties, whereby the support member 35 does not conduct electricity after the power connector assembly is applied to the server, thereby avoiding a problem that electric energy may be leaked after the first power connector 10 or the second power connector 30 is connected to the power supply and the support member 35 transmits the leaked electric energy. Moreover, the support member 35 is in contact with the motherboard 300, and electric energy on the motherboard 300 is not transmitted to the support member 35, whereby the motherboard 300 has certain safety. That is, by forming the support member 35 of an insulating material, it is possible to improve the safety of supplying power to the server.

In addition, in some embodiments, as shown in FIG. 2, the first connection plate 13 is bent to form a first connection sub-plate 131 and a second connection sub-plate 132. The first connection sub-plate 131 is connected to the second connection sub-plate 132, and the first connection sub-plate 131 is connected to the first connection terminal 12. The second connection sub-plate 132 covers the connection member 20 in a direction from the first accommodating cavity 111 to the first opening 112, and the second connection sub-plate 132 is configured to be connected to the motherboard 300. The second connection sub-plate 132 is twisted relative to the connection member 20 to increase a gap between two adjacent second connection sub-plates 132.

When the power connector assembly is applied to the server, the cold air window on the chassis faces the second connection sub-plate 132, the second connection sub-plate 132 covers the connection member 20, and the gap between the second connection sub-plates 132 is small, thereby allowing cold air to be transmitted to the connection member 20 from the small gap, and then to the lower power supply of the power supplies stacked up and down through the through hole 221 on the connection member 20, and realizing heat dissipation from the lower power supply. By twisting the second connection sub-plate 132 relative to the connection member 20, the gap between the two adjacent second connection sub-plates 132 increases. Therefore, when the cold air is transmitted to the second connection sub-plate 132, more cold air may be transmitted to the connection member 20 through the larger gap, and then to the lower power supply, whereby the heat dissipation efficiency of the lower power supply may be improved, and heat may be well dissipated from the lower power supply.

It should be noted that the middle portion of the second connection sub-plate 132 may be twisted relative to the connection member 20, thereby increasing the gap between the middle portions of the second connection sub-plates 132. Certainly, the entire second connection sub-plate 132 may be twisted relative to the connection member 20, thereby increasing the gap between two adjacent second connection sub-plates 132.

In addition, in some embodiments, as shown in FIG. 2, the second connection plate 33 is bent to form a third connection sub-plate 331 and a fourth connection sub-plate 332. The third connection sub-plate 331 is connected to the fourth connection sub-plate 332, and the third connection sub-plate 331 is connected to the second connection terminal 32. A distance from the second connection sub-plate 132 to the first housing 11 is greater than a distance from the fourth connection sub-plate 332 to the second housing 31.

With such arrangement, when the second connection sub-plate 132 is connected to the motherboard 300, the fourth connection sub-plate 332 is equivalent to avoiding the second connection sub-plate 132, thereby avoiding a problem that the fourth connection sub-plate 332 affects the connection between the second connection sub-plate 132 and the motherboard 300. That is, the distance between the second connection sub-plate 132 and the first housing 11 is greater than the distance between the fourth connection sub-plate 332 and the second housing 31, thereby facilitating the connection between the second connection sub-plate 132 and the motherboard 300.

It should be noted that if the distance between the second connection sub-plate 132 and the first housing 11 is equal to or smaller than the distance between the fourth connection sub-plate 332 and the second housing 31, when the second connection sub-plate 132 extends downward and is connected to the motherboard 300, both the third connection sub-plate 331 and the fourth connection sub-plate 332 obstruct the second connection sub-plate 132, thereby not facilitating the connection between the second connection sub-plate 132 and the motherboard 300.

In addition, in some embodiments, as shown in FIG. 6, the first connection plate 13 may include a first-type connection plate 1301 and a second-type connection plate 1302. A width of the first-type connection plate 1301 is greater than a width of the second-type connection plate 1302. With such arrangement, the connection plates of different widths may be connected to the first connection terminal 12, whereby the connection between the first power connector 10 and the motherboard 300 is relatively stable. In addition, the connection plates of different widths are arranged. Therefore, when the power connector transmits electric energy through the connection plates, the efficiency of transmitting electric energy by the connection plates of different widths is different, whereby the efficiency of transmitting electric energy by the power connector may be better.

The number of the first-type connection plates 1301 and the number of the second-type connection plates 1302 may be set according to actual needs. In addition, the position of the first-type connection plate 1301 and the position of the second-type connection plate 1302 may also be set according to actual needs.

In addition, in some embodiments of the present application, the second connection plate 33 may also include a first-type connection plate 1301 and a second-type connection plate 1302. A width of the first-type connection plate 1301 is greater than a width of the second-type connection plate 1302. With such arrangement, the connection plates of different widths may be connected to the second connection terminal 32, whereby the connection between the second power connector 30 and the motherboard 300 is relatively stable.

In some embodiments of the present application, the first power connector 10 and the second power connector 30 are arranged in stacked, and the gap is provided between the first power connector 10 and the second power connector 30. The connection member 20 is located in the gap, and the connection member 20 is separately fixedly connected to the first power connector 10 and the second power connector 30. Therefore, when the power connector assembly provided by some embodiments of the present application is used, that is, when the power connector assembly provided by some embodiments of the present application is applied to a chassis of a server, two power supplies stacked up and down in the chassis may be connected to the first power connector 10 and the second power connector 30, respectively, and the first power connector 10 and the second power connector 30 may be directly connected to the motherboard 300 in the chassis, whereby the two power supplies stacked up and down are electrically connected to the motherboard 300 through the power connector assembly of the present application, thereby supplying power to the motherboard 300, namely, supplying power to the server. That is, in some embodiments of the present application, the first power connector 10 and the second power connector 30 are arranged in stacked, and the connection member 20 is arranged between the first power connector 10 and the second power connector 30 and is separately connected to the first power connector 10 and the second power connector 30, whereby when the power connector assembly is applied to the chassis of the server, the two power supplies stacked up and down are connected to the first power connector 10 and the second power connector 30, respectively, and the first power connector 10 and the second power connector 30 are connected to the motherboard 300 in the chassis, thereby supplying power to the motherboard 300, avoiding using a power board 004 and a plurality of connectors, and reducing the cost of supplying power to the server. In addition, only using the power connector assembly according to some embodiments of the present application is equivalent to reducing the number of devices in the chassis, whereby less space is occupied in the chassis, and space utilization in the chassis 300 is improved. In addition, once there are fewer devices in the chassis, there is more space left for the motherboard in the chassis, thereby increasing the size of the motherboard 300.

Figures 14, 15:
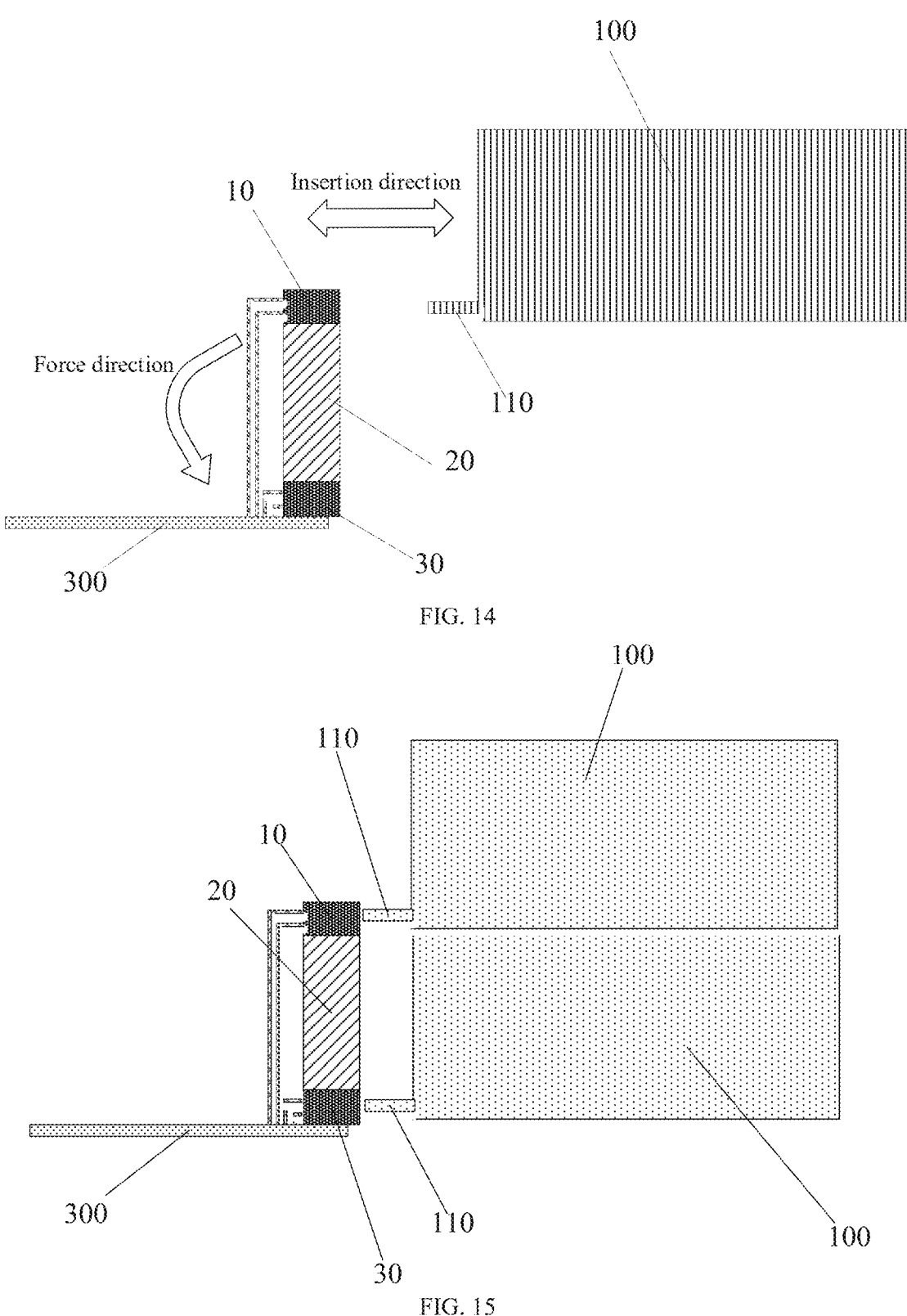
FIG. 14 shows a first schematic diagram of a power supply system according to some embodiments of the present application.
FIG. 15 shows a second schematic diagram of a power supply system according to some embodiments of the present application.
Figure 16:
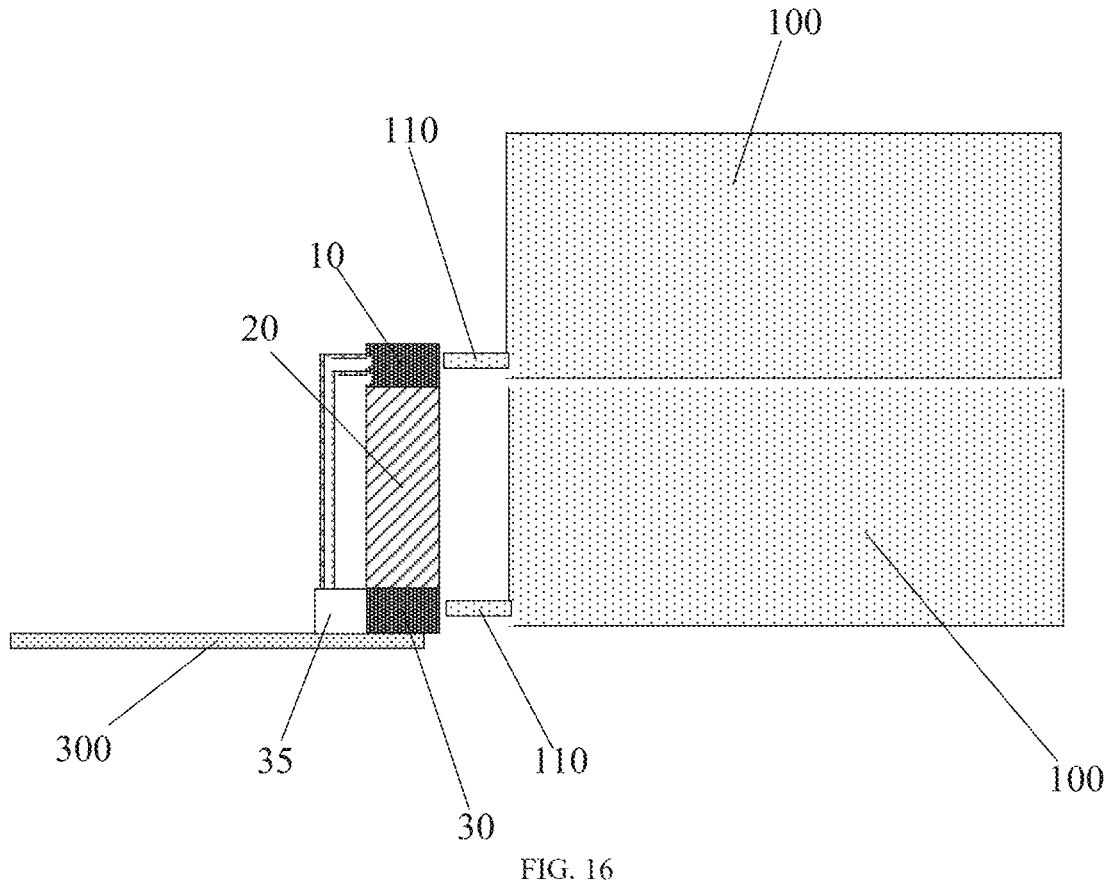
FIG. 16 shows a third schematic diagram of a power supply system according to some embodiments of the present application.

Some embodiments of the present application provide a power supply system. As shown in FIG. 14 and FIG. 15, the power supply system includes one or a plurality of power supplies 100, a motherboard, and the power connector assembly in any of the foregoing embodiments.

The power supply 100 has a gold finger 110, and both the first power connector 10 and the second power connector 30 are connected to the motherboard 300. In response to one power supply 100, the gold finger 110 of the power supply 100 is inserted into the second power connector 30. In response to the plurality of power supplies 100, the plurality of power supplies 100 are arranged in stacked, the gold finger 110 of one power supply 100 of the two adjacent power supplies 100 among the plurality of power supplies 100 is inserted into the first power connector 10, and the gold finger 110 of the other power supply 100 of the two adjacent power supplies 100 is inserted into the second power connector 30.

In some embodiments of the present application, the first power connector 10 and the second power connector 30 are arranged in stacked, and the gap is provided between the first power connector 10 and the second power connector 30. The connection member 20 is located in the gap, and the connection member 20 is separately fixedly connected to the first power connector 10 and the second power connector 30. Therefore, the first power connector 10 may correspond to the power supply 100, and the second power connector 30 may also correspond to the power supply 100, whereby the gold finger 110 of the power supply 100 is inserted into the first power connector 10, and the gold finger 110 of the power supply 100 is inserted into the second power connector 30, thereby realizing the connections of the power supply 100 and the power supply 100 to the first power connector 10 and the second power connector 30, respectively. The first power connector 10 and the second power connector 30 are connected to the motherboard 300, whereby the power supply 100 and the power supply 100 may supply power to the server. That is, in some embodiments of the present application, the first power connector 10 and the second power connector 30 are arranged in stacked, and the connection member 20 is arranged between the first power connector 10 and the second power connector 30 and is separately connected to the first power connector 10 and the second power connector 30. Then, the first power connector 10 and the second power connector 30 may be separately connected to the power supply 100, and the first power connector 10 and the second power connector 30 are connected to the motherboard 300 to supply power to the server, thereby avoiding using a power board 004 and a plurality of connectors, and reducing the cost of supplying power to the server. In addition, only using the power connector assembly according to some embodiments of the present application is equivalent to reducing the number of devices in the chassis, whereby less space is occupied in the chassis, and space utilization in the chassis 300 is improved. In addition, once there are fewer devices in the chassis, there is more space left for the motherboard in the chassis, thereby increasing the size of the motherboard 300.

It should be noted that the power supply 100 may be a common redundancy power supply (CRPS).

In addition, in some embodiments of the present application, in response to the plurality of power supplies 100, the specific number of the power supplies 100 may be set according to actual needs. For example, the number of the power supplies 100 is two. For another example, the number of the power supplies 100 is four. The specific number of the power supplies 100 is not limited in some embodiments of the present application herein. In addition, in some embodiments of the present application, there are a plurality of power supplies 100, indicating that the number of the power supplies 100 is greater than 1.

In addition, in some embodiments, the first power connector 10 includes a first housing 11, a plurality of first connection terminals 12, and a plurality of first connection plates 13. The second power connector 30 includes a second housing 31, a plurality of second connection terminals 32, and a plurality of second connection plates 33. The second housing 31 is in contact with the motherboard 300. Both the first connection plate 13 and the second connection plate 33 are electrically connected to the motherboard 300.

With such arrangement, after electric energy of the power supply 100 is transmitted to the first connection terminal 12, the first connection terminal 12 may transmit the electric energy to the first connection plate 13, and the first connection plate 13 transmits the electric energy to the motherboard 300. After the electric energy of the power supply 100 is transmitted to the second connection terminal 32, the second connection terminal 32 may transmit the electric energy to the second connection plate 33, and the second connection plate 33 transmits the electric energy to the motherboard 300.

In addition, in some embodiments, the first connection plate 13 and the second connection plate 33 are welded to the motherboard 300. With such arrangement, the first connection plate 13 and the second connection plate 33 may be connected to the motherboard 300 more firmly, thereby avoiding a problem that the first connection plate 13 and the second connection plate 33 are likely to be separated from the motherboard 300.

Certainly, a manner of electrically connecting the first connection plate 13 and the second connection plate 33 to the motherboard 300 may also be that a conductive boss is provided on the motherboard 300, a slot is provided on the conductive boss, and the first connection plate 13 and the second connection plate 33 are separately inserted into the slot and are in close contact with a slot wall of the slot, thereby realizing the electrical connection of the first connection plate 13 and the second connection plate 33 to the motherboard 300. The manner of electrically connecting the first connection plate 13 and the second connection plate 33 to the motherboard 300 is not limited in some embodiments of the present application herein.

In addition, in some embodiments, the connection member 20 has a first connection portion 21, an intermediate connection portion 22, and a second connection portion 23. The first connection portion 21, the intermediate connection portion 22, and the second connection portion 23 are connected in sequence. The first connection portion 21 is connected to the first power connector 10. The second connection portion 23 is connected to the second power connector 30. The intermediate connection portion 22 is provided with a plurality of through holes 221. In a direction from the second power connector 30 to the power supply 100, the intermediate connection portion 22 faces the power supply 100 inserted into the second power connector 30, and the plurality of through holes 221 all face the power supply 100 inserted into the second power connector 30.

With such arrangement, once the power supply 100 is separately inserted into the first power connector 10 and the second power connector 30, the connection member 20 covers the power supply 100. However, the plurality of through holes 221 on the intermediate connection portion 22 of the connector may be used for ventilation, whereby cold air in the server may be transmitted to the power supply 100 through the plurality of through holes 221, and heat may be effectively dissipated from the power supply 100. That is, by providing the plurality of through holes 221 on the intermediate connection portion 22, the intermediate connection portion 22 faces the power supply 100, thereby facilitating effective heat dissipation from the power supply 100.

It should be noted that a cold air window is generally arranged on the chassis of the server. The cold air window faces the connection member 20. The intermediate connection portion 22 of the connection member 20 is provided with the plurality of through holes 221, which may ensure that cold air is transmitted to the lower power supply through a plurality of windows.

In addition, in some embodiments, a support member 35 is fixedly connected to the second housing 31. The second housing 31 is in contact with the motherboard 300. The support member 35 is in contact with the motherboard 300, and supports the second housing 31 in a direction parallel to the motherboard 300.

When the gold finger 110 of one power supply 100 is inserted into the first accommodating cavity 111 in the first housing 11 of the first power connector 10 and the gold finger 110 of the other power supply 100 is inserted into the second accommodating cavity 311 in the second housing 31 of the second power connector 30, the first power connector 10 or the second power connector 30 may shake. The support member 35 is fixedly connected to the second housing 31, the extension direction of the support member 35 is parallel to the direction from the second opening 312 to the second accommodating cavity 311, and the support member 35 is in contact with the motherboard 300, which is equivalent to the extension direction of the support member 35 being parallel to the surface of the motherboard 300. The support member 35 supports the second housing 31 in a direction parallel to the motherboard 300. That is, the second housing 31 is supported in a direction in which the gold finger 110 is inserted into the second power connector 30, thereby avoiding a problem of the second housing 31 shaking due to the insertion, and facilitating the insertion of the gold finger 110 into the second power connector 30.

In addition, in some embodiments, a second fixing table 34 is fixedly connected to an outer wall of the second housing 31. A second fixing hole 341 is provided on the second fixing table 34. A fixing member penetrates into the second fixing hole 341, and the fixing member is connected to the motherboard 300, to connect the second fixing table 34 to the motherboard 300, whereby the second housing 31 is fixed relative to the motherboard 300.

With such arrangement, the fixing member is embedded in the motherboard 300 by penetration of the fixing member into the second fixing hole 341 on the second fixing table 34, whereby the second fixing table 34 and the motherboard 300 are connected by the fixing member, and the second fixing table 34 is fixedly connected to the second housing 31. After the second fixing base 34 is connected to the motherboard 300, the second housing 31 is equivalent to being fixed to the motherboard 300, thereby avoiding a problem of the second housing 31 shaking relative to the motherboard 300. That is, by arranging the second fixing table 34, and arranging the second fixing hole 341 on the second fixing table 34, the second housing 31 may be fixed relative to the motherboard 300. Therefore, when the gold finger of the power supply in the chassis is inserted into the second housing 31, the second housing 31 is stable, and the gold finger may be inserted into the second accommodating cavity 311 of the second housing 31.

Some embodiments of the present application provide a server. The server includes a chassis and the power supply system in any of the foregoing embodiments. The power supply system is located in the chassis.

In the description of this specification, the reference to the terms "some embodiments", "illustrative embodiments", "examples", "specific examples", or "some examples" means that specific features, structures, materials, or characteristics described in conjunction with some embodiments or examples are included in some embodiments or examples of the present application. In this specification, the illustrative expressions of the above terms may not necessarily refer to the same embodiments or examples. Moreover, the specific features, structures, materials, or characteristics described may be combined in any appropriate way in any embodiment or example.

Although some embodiments of the present application have been shown and described, those skilled in the art may understand that various changes, modifications, substitutions, and variations may be made to these embodiments without departing from the principles and purposes of the present application, and the scope of the present application is limited by the claims and their equivalents.

The invention claimed is:

1. A power connector assembly, comprising a first power connector, a connection member, and a second power connector;

wherein the first power connector and the second power connector are arranged in stacked, and a gap is provided between the first power connector and the second power connector; the connection member is located in the gap, and the connection member is separately fixedly connected to the first power connector and the second power connector;

both the first power connector and the second power connector are configured to connect a power supply for supplying power to a server, and are configured to connect a motherboard of the server;

wherein the connection member has a first connection portion, an intermediate connection portion, and a second connection portion;

the first connection portion, the intermediate connection portion, and the second connection portion are connected in sequence, and the first connection portion is connected to the first power connector, the second connection portion is connected to the second power connector, and the intermediate connection portion is provided with a plurality of through holes, and the plurality of through holes on the entire intermediate connection portion are arranged in array;

the first power connector comprises a first housing, a plurality of first connection terminals, and a plurality of first connection plates, the first housing has a first accommodating cavity and a first opening, the first connection terminals are electrically connected to the first connection plates, the first connection plates are located outside the first accommodating cavity and are located on a side of the first accommodating cavity away from the first opening; the second power connector comprises a second housing, a plurality of second connection terminals, and a plurality of second connection plates; the second housing has a second accommodating cavity and a second opening, the second connection terminals are electrically connected to the second connection plates, the second connection plates are located outside the second accommodating cavity and are located on a side of the second accommodating cavity away from the second opening; and the first connection plate is bent to form a first connection sub-plate and a second connection sub-plate; the first connection sub-plate is connected to the second connection sub-plate, and the first connection sub-plate is connected to the first connection terminal; the second connection sub-plate covers the connection member in a direction from the first accommodating cavity to the first opening, and the second connection sub-plate is configured to be connected to the motherboard; and the second connection sub-plate is twisted relative to the connection member to increase a gap between two adjacent second connection sub-plates.

2. The power connector assembly according to claim 1, wherein the plurality of through holes are in a shape of at least one of a circle, a rhombus, a square, and a polygon, and a number of sides of the polygon is greater than or equal to 5.

3. The power connector assembly according to claim 1, wherein the connection member is made of an insulating material.

4. The power connector assembly according to claim 1, wherein the power supply comprises a gold finger, and the server comprises a motherboard;

the plurality of first connection terminals are mounted on a cavity wall of the first accommodating cavity, the first connection terminals are in one-to-one correspondence with the first connection plates the first connection terminals are configured to abut against the gold finger, and the first connection plates are configured to be connected to the motherboard;

the plurality of second connection terminals are mounted on a cavity wall of the second accommodating cavity, the second connection terminals are in one-to-one correspondence with the second connection plates and the second connection terminals are configured to abut against the gold finger, the second connection plates are configured to be connected to the motherboard, and the second housing is configured to be in contact with the motherboard.

5. The power connector assembly according to claim 4, wherein a second fixing table is fixedly connected to an outer wall of the second housing, the second fixing table is provided with a second fixing hole, and the second fixing hole is configured for penetration of a fixing member, to connect the second fixing table to the motherboard, so that the second housing is fixed relative to the motherboard.

6. The power connector assembly according to claim 5, wherein the server comprises a chassis, a first fixing table is fixedly connected to an outer wall of the first housing, the first fixing table is provided with a first fixing hole, and the first fixing hole is configured for penetration of a fixing member, to fixedly connect the first fixing table to the chassis, so that the first housing is fixed relative to the chassis.

7. The power connector assembly according to claim 5, wherein the second fixing table is separately fixedly connected to opposite sides of the second housing.

8. The power connector assembly according to claim 4, wherein a support member is fixedly connected to the second housing, an extension direction of the support member is parallel to a direction from the second opening to the second accommodating cavity, and the support member is configured to come into contact with the motherboard when the second housing is in contact with the motherboard, and supports the second housing in a direction parallel to the motherboard.

9. The power connector assembly according to claim 8, wherein the support member is fixedly connected to an outer wall of the second housing away from the second opening.

10. The power connector assembly according to claim 9, wherein a thickness of the support member is equal to a thickness of the second housing.

11. The power connector assembly according to claim 8, wherein the support member is made of an insulating material.

12. The power connector assembly according to claim 8, wherein the support member is fixedly connected to a partial edge of the second opening.

13. The power connector assembly according to claim 1, wherein the second connection plate is bent to form a third connection sub-plate and a fourth connection sub-plate; the third connection sub-plate is connected to the fourth connection sub-plate, and the third connection sub-plate is connected to the second connection terminal; and a distance from the second connection sub-plate to the first housing is greater than a distance from the fourth connection sub-plate to the second housing.

14. The power connector assembly according to claim 1, wherein the first connection plate comprises a first-type connection plate and a second-type connection plate, and a width of the first-type connection plate is greater than a width of the second-type connection plate.

15. A power supply system, comprising one or a plurality of power supplies, a motherboard, and the power connector assembly according to claim 1, wherein the power supply has a gold finger, and both the first power connector and the second power connector are connected to the motherboard;

in response to one power supply, the gold finger of the power supply is inserted into the second power connector; and in response to the plurality of power supplies, the plurality of power supplies are arranged in stacked, the gold finger of one of two adjacent power supplies among the plurality of power supplies is inserted into the first power connector, and the gold finger of the other of the two adjacent power supplies is inserted into the second power connector.

16. The power supply system according to claim 15, wherein the second housing is in contact with the motherboard, and both the first connection plate and the second connection plate are electrically connected to the motherboard.

17. The power supply system according to claim 16, wherein a support member is fixedly connected to the second housing, the second housing is in contact with the motherboard, and the support member is in contact with the motherboard, and supports the second housing in a direction parallel to the motherboard.

18. The power supply system according to claim 17, wherein a second fixing table is fixedly connected to an outer wall of the second housing, the second fixing table is provided with a second fixing hole, a fixing member is penetrated into the second fixing hole, and the fixing member is connected to the motherboard, to connect the second fixing table to the motherboard, so that the second housing is fixed relative to the motherboard.

19. The power supply system according to claim 15, wherein in a direction from the second power connector to the power supply, the intermediate connection portion faces the power supply inserted into the second power connector, and the plurality of through holes all face the power supply inserted into the second power connector.

20. A server, comprising a chassis and the power supply system according to claim 15, wherein the power supply system is located in the chassis.

\* \* \* \* \*